(12) United States Patent
Joo et al.

(10) Patent No.: US 10,720,379 B2
(45) Date of Patent: Jul. 21, 2020

(54) ROBUST INTEGRATED CIRCUIT PACKAGE

(71) Applicant: Cree, Inc., Durham, NC (US)

(72) Inventors: Sung Chul Joo, Cary, NC (US);
Bradley Millon, Durham, NC (US);
Erwin Cohen, Durham, NC (US)

(73) Assignee: CREE, INC., Durham, NC (US)

( * ) Notice: Subject to any disclaimer, the term of this patent is extended or adjusted under 35 U.S.C. 154(b) by 29 days.

(21) Appl. No.: 16/226,517

(22) Filed: Dec. 19, 2018

(65) Prior Publication Data

US 2020/0203260 A1 Jun. 25, 2020

(51) Int. Cl.

| | |
|---|---|
| *H01L 23/22* | (2006.01) |
| *H01L 23/495* | (2006.01) |
| *H01L 23/34* | (2006.01) |
| *H01L 23/31* | (2006.01) |
| *H01L 23/60* | (2006.01) |

(52) U.S. Cl.
CPC .... *H01L 23/49506* (2013.01); *H01L 23/3114* (2013.01); *H01L 23/34* (2013.01); *H01L 23/60* (2013.01)

(58) Field of Classification Search
CPC .................................................. H01L 23/49506
USPC .......................................................... 257/687
See application file for complete search history.

(56) References Cited

U.S. PATENT DOCUMENTS

| | | | |
|---|---|---|---|
| 8,330,265 B2 | 12/2012 | Farrell et al. | |
| 8,592,966 B2 | 11/2013 | Wood et al. | |
| 2002/0051353 A1 | 5/2002 | Osakada | |
| 2011/0084371 A1 | 4/2011 | Rotay et al. | |
| 2012/0235288 A1* | 9/2012 | Shinkai | H01L 23/3107 257/676 |
| 2016/0336255 A1 | 11/2016 | Miyawaki | |
| 2017/0062358 A1* | 3/2017 | Pueschner | H01L 23/562 |
| 2017/0213782 A1 | 7/2017 | Iwai | |
| 2017/0301594 A1 | 10/2017 | Takamura | |
| 2018/0190606 A1 | 7/2018 | Williamson et al. | |

FOREIGN PATENT DOCUMENTS

WO       2007007239 A2     1/2007

* cited by examiner

*Primary Examiner* — Ajay Arora

(74) *Attorney, Agent, or Firm* — Coats & Bennett, PLLC

(57) ABSTRACT

The base of an integrated circuit package comprises a first side, and a second side opposing the first side. The base further comprises, a base mounting section, a die mounting section, and a recessed section. The recessed section comprises a recess between the die mounting section and the base mounting section. The base further comprises an opening extending through the base from the first side to the second side. At least a portion of the recess intersects with the opening.

20 Claims, 6 Drawing Sheets

US 10,720,379 B2

ROBUST INTEGRATED CIRCUIT PACKAGE

BACKGROUND

An integrated circuit (IC) is a circuit in which electronic components of the circuit are fabricated as a single unit, e.g., on a substrate of semiconductor material. An IC package is a structure supporting an IC that serves one or more important functions. Often, an IC package serves to protect an IC from environmental factors (e.g., that might cause physical damage or corrosion), regulates thermal properties of the IC (e.g., to prevent thermal fatigue), arranges for electrical connectivity of the IC to other electronics, and/or increases the mechanical stability of the IC on a given substrate to which the IC is mounted. It is challenging to design an IC package that robustly serves one or more of these purposes, particularly when the IC is to be used in certain demanding environments.

SUMMARY

Embodiments of the present disclosure are generally directed to IC packages. Particular embodiments are able to provide robust protection against external stressors. Such stressors may include, but are not limited to, thermal fatigue during operation of the IC, and mechanical stress applied during installation of the IC package and/or resulting from thermal expansion/contraction of IC components.

In particular, one or more embodiments include an IC package comprising a base and an electrically-insulating die housing. The base comprises a first side, a second side opposing the first side, a base mounting section and a die mounting section. The base further comprises a recessed section. The recessed section comprises a recess between the die mounting section and the base mounting section. The base further comprises an opening extending through the base from the first side to the second side. At least a portion of the recess intersects with the opening. The electrically-insulating die housing is mounted to the die mounting section.

One or more other embodiments include an IC package comprising a base. The base comprises a die mounting section, a base mounting section, and a recessed section positioned between the die mounting section and the base mounting section. The IC package further comprises an opening that extends through the base at the base mounting section and the recessed section. The recessed section is configured to reduce mechanical stress on the die mounting section when torque is applied to a fastener that is disposed within the opening.

One or more other embodiments include an IC package comprising a base. The base comprises a die mounting section, a base mounting section, and a recessed section positioned between the die mounting section and the base mounting section. The IC package further comprises an electrically-insulating die housing mounted to the die mounting section. The die housing comprises a die cavity and a lead channel spaced apart from the die cavity. The IC package further comprises a lead seated partially within the lead channel and extending away from the die cavity. The lead avoids cracking of the die housing due to mechanical stress imposed by the lead upon the die housing when the lead is soldered to a pad on a mounting surface and one thousand ambient temperature cycles between −40 degrees Celsius and 85 degrees Celsius are performed.

One or more other embodiments include a method of mounting an IC package. The method comprises inserting a fastener through an opening extending through the integrated circuit package. The opening is at a recessed section and a base mounting section of the integrated circuit package. The method further comprises mating a head of the inserted fastener to a mating surface of the base mounting section such that the head of the fastener is spaced apart from the recessed section. The method further comprises applying torque to the inserted fastener to secure the base mounting section between the mated head of the fastener and a mounting surface while keeping the head of the fastener spaced apart from the recessed section.

According to particular embodiments, any of the embodiments above may further include one or more of the features discussed below.

BRIEF DESCRIPTION OF THE DRAWINGS

Aspects of the present disclosure are illustrated by way of example and are not limited by the accompanying figures with like references indicating like elements. In general, the use of a reference numeral should be regarded as referring to the depicted subject matter according to one or more embodiments, whereas discussion of a specific instance of an illustrated element will append a letter designation thereto (e.g., discussion of a lead 70, generally, as opposed to discussion of particular instances of particular leads 70a, 70b).

DETAILED DESCRIPTION

Figure 1A:
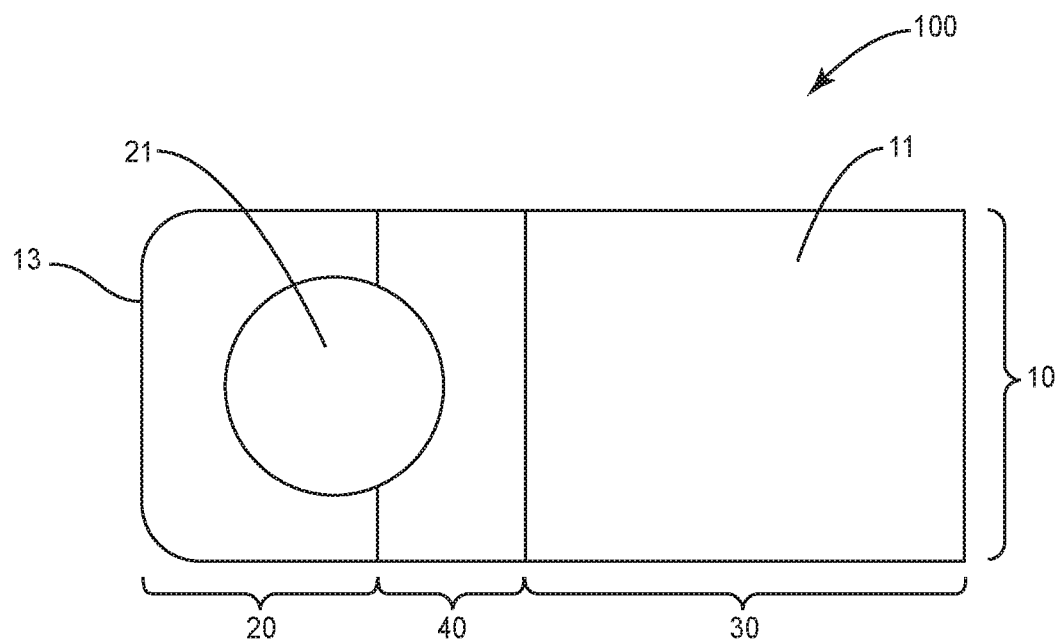
FIGS. 1A and 1B are schematic diagrams of an example IC package as viewed from the top and side, respectively, according to one or more embodiments of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As discussed above, an IC package is a structure for supporting an IC that may, for example, protect an IC from environmental factors (e.g., that might cause physical damage or corrosion), regulate thermal properties of the IC (e.g., to prevent thermal fatigue), arrange for electrical connectivity of the IC to other electronics, and/or increase the mechanical stability of the IC on a given substrate to which the IC is mounted. FIG. 1A is a schematic view of an IC package 100 that may be useful for one or more such purposes and/or other useful purposes, in accordance with one or more embodiments of the present disclosure.

The IC package 100 comprises a base 10. In FIG. 1A, a first side 11 of the base 10 is visible. The base may be made, in whole or in part, of one or more materials (e.g., alloys, composites, ceramics) having a high thermal conductivity (e.g., Copper-Tungsten (CuW), Copper-Molybdenum-Copper (CMC)). In some particular example embodiments, the base is made from CuW 15:85, CuW 10:90, CMC 1:1:1, or CMC 1:3:1.

The base 10 comprises a base mounting section 20, a die mounting section 30, and a recessed section 40 positioned between the base mounting section 20 and the die mounting section 30. The base 10 further comprises an opening 21 at the base mounting section 20 and the recessed section 40.

Figure 1B:
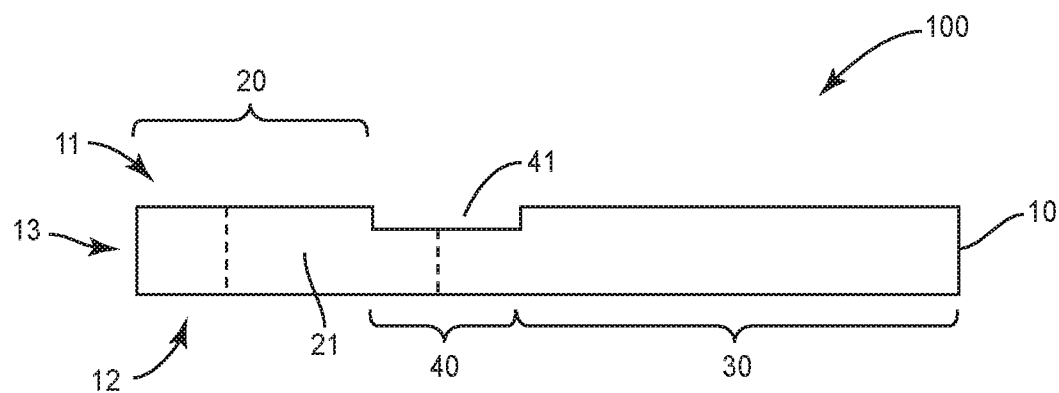

FIG. 1B illustrates a side view of the same example IC package 100 shown in FIG. 1A. As shown in FIG. 1B, the base 10 of the IC package 100 comprises a first side 11 (e.g., a "top" side), a second side 12 (e.g., a "bottom" side), and a lateral side 13. The second side 12 opposes the first side 11. The lateral side 13 connects the first and second sides 11, 12.

As can be seen in FIG. 1B, the recessed section 40 of the IC package 100 comprises a recess 41 that is between the die mounting section 30 and the base mounting section 20. Accordingly, a thickness of the base 10 throughout the recessed section 40, as measured between the first and second sides 11, 12, is less than the thickness of the base 10 throughout the base mounting section 20. For example, the thickness of the recessed section 40 may be between 10 and 20 mils less than the thickness of the base mounting section 20. In other examples, the difference in thickness may be even greater. In this example, the thickness of the base 10 throughout the recessed section 40 is also less than the thickness of the base 10 throughout the die mounting section 30.

Although FIG. 1B depicts the thickness of the base throughout the base mounting section 20 as having the same thickness as the base 10 throughout the die mounting section 30, other embodiments of the IC package 100 may include a base mounting section 20 and die mounting section 30 of different thicknesses.

The base 10 further comprises an opening 21 extending through the base 10 from the first side 11 to the second side 12. Although the opening 21 does not extend through the lateral side 13 in this example, other examples of the IC package 100 may include an opening 21 that does extend through the lateral side 13, as will be discussed in further detail below.

Figure 2:
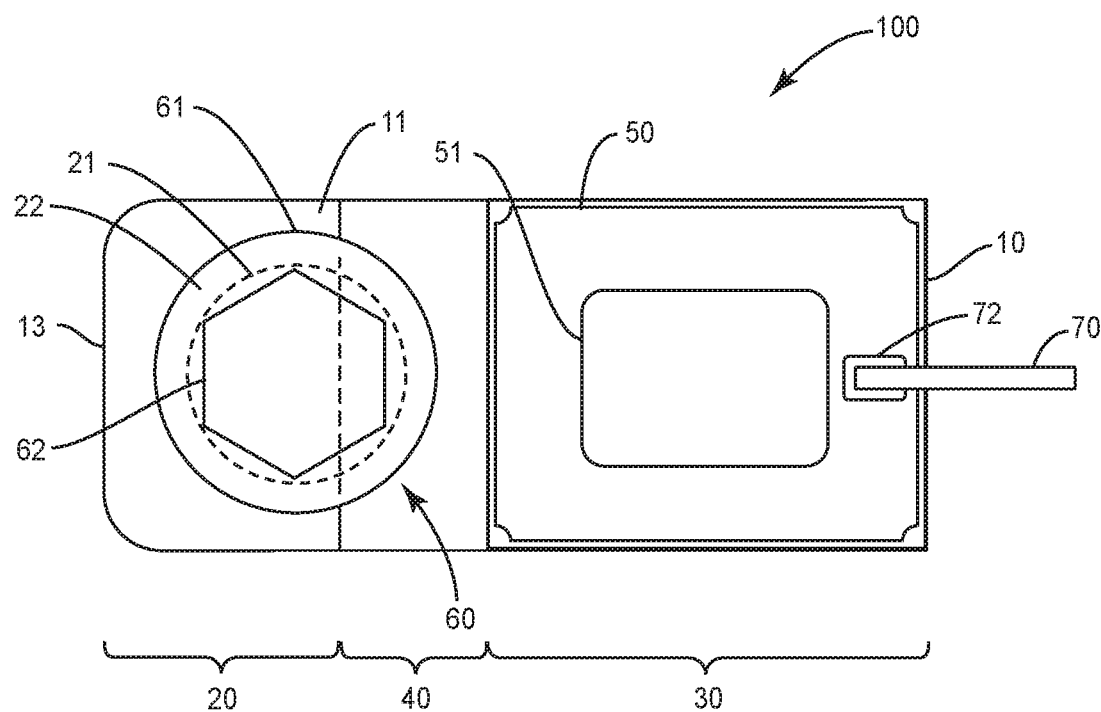
FIG. 2 is a schematic diagram of another example IC package as viewed from the top, according to one or more embodiments of the present disclosure.

As shown in FIG. 1B, at least a portion of the recess 41 intersects with the opening 21. In this particular example, the opening 21 extends through the base 10 at both the base mounting section 20 and the recessed section 40. The opening 21 may be used to mount the IC package 100 to a mounting surface (e.g., a printed circuit board) by use of a fastener 60 (e.g., a bolt, a screw), as shown in FIG. 2. In some embodiments, a thermal interface material (e.g., thermal grease, adhesive, or tape) (not shown) may be used between the base 10 and the mounting surface to enhance thermal performance.

FIG. 2 illustrates a variation of the example IC package 100 according to particular embodiments, such that the first side 11 of the IC package 100 is in view. In particular, FIG. 2 includes all of the elements of the IC package 100 discussed above with respect to FIGS. 1A and 1B, as well as a fastener 60 for mounting the IC package 100 to a mounting surface, and other components supporting electrical connectivity between an IC die and other electronics as may be on the mounting surface, as will be further discussed below.

To mount the IC package 100 to a mounting surface, the fastener 60 is inserted through the opening 21 at the base mounting section 20 and recessed section 40. In addition, a head 61 of the inserted fastener 60 is mated to a mating surface 22 of the base mounting section 20. Torque is applied to the inserted fastener 60 (e.g., using a tool inserted into a socket 62 in the head 61 of the fastener 60) to secure the base mounting section 20 between the mated head 61 of the fastener 60 and the mounting surface (which will be shown in further examples below).

In the example of FIG. 2, the IC package 100 further comprises an electrically-insulating die housing 50 mounted to the die mounting section 30. The die housing 50 comprises a die cavity 51. The die cavity 51 may, for example, accept insertion of an IC die, as will be shown and discussed in greater detail below.

Figure 3:
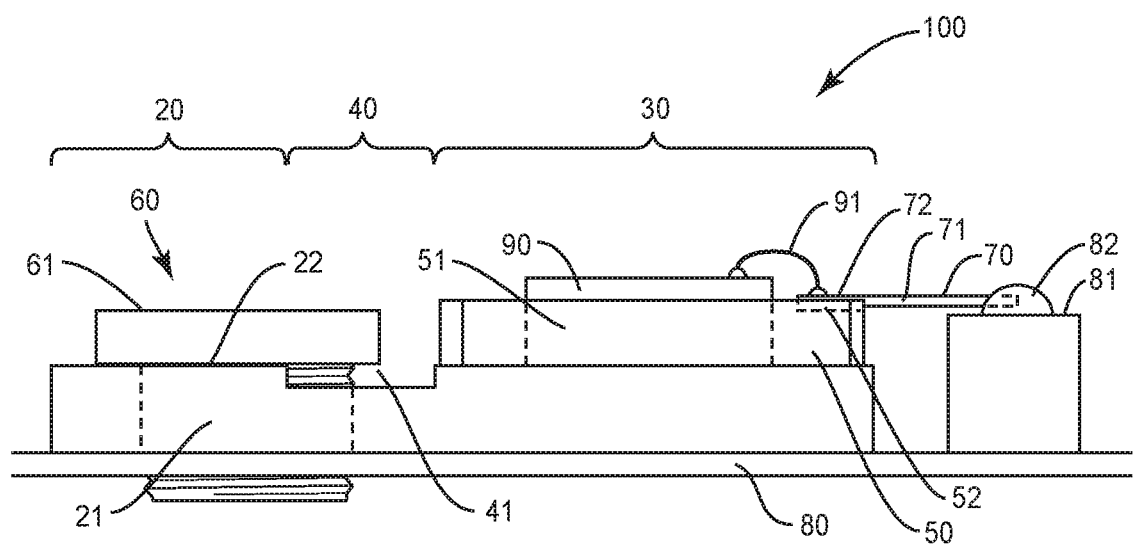
FIG. 3 is a schematic diagram of yet another example IC package mounted to a mounting surface and as viewed from the side, according to one or more embodiments of the present disclosure.

The IC package 100 further comprises a lead 70 extending away from the die cavity 51. The lead is connected to a lead pad 72 and is seated partially within a lead channel 52 of the die housing 50, as shown in FIG. 3. Note that although the example IC package 100 of FIG. 2 illustrates a single lead 70, other embodiments of the IC package 100 will be discussed below that comprise one or more additional leads 70. For example, embodiments that include two leads may use one lead to carry positive supply voltage, and the other to carry negative supply voltage or ground. Embodiments that use three leads may respectively use one lead for positive supply voltage, negative supply voltage, and ground. Embodiments that use four leads may, for example, use two leads for positive and negative supply voltage, respectively, and two leads for input and output signaling, respectively. Other embodiments may use one or more leads to carry power, signaling, reference voltage, and/or ground, among other things.

FIG. 3 illustrates the IC package 100 of FIG. 2 as viewed from the side, mounted to a mounting surface 80, and comprising an IC die 90 that is electrically connected to a pad 81 on the mounting surface 80 via the lead 70. From the illustration of FIG. 3, it can be seen that the head 61 of the inserted fastener 60 is mated to the mating surface 22 of the base mounting section 20 such that the head 61 of the fastener 60 is spaced over and apart from the recessed section 40 of the base 10.

According to embodiments, torque is applied to the inserted fastener 60 to secure the base mounting section 20 between the mated head 61 of the fastener 60 and the mounting surface 80 while keeping the head 61 of the fastener 60 spaced apart from the recessed section 40. Although typical embodiments of the present disclosure may include applying between 40 and 60 inch-ounces of torque to the fastener 60 in order to mount the IC package 100 to the mounting surface 80, other embodiments may apply even more torque (e.g., up to 80 inch-ounces). In some embodiments, this torque may impose mechanical stress on the die mounting section 30 via the recessed section 40 and base mounting section 20. Accordingly, in at least some embodiments, the recessed section 40 is configured to reduce the mechanical stress applied to the die mounting section 30 when torque is applied to the fastener 60 disposed within the opening 21. In some such embodiments, the recessed section 40 is configured to reduce mechanical stress on the die mounting section 30 particularly when torque is applied to the fastener 60 while the mating surface 22 and head 61 of the fastener 60 are mated.

FIG. 3 also shows lead 70 of the IC package 100 connected to a pad 81 on the mounting surface 80 by solder 82. The lead 70 extends away from the die cavity 51 and is seated partially within a lead channel 52 of the die housing 50. In some embodiments, the lead 70 is configured to avoid cracking of the die housing 50 due to mechanical stress imposed by the lead 70 upon the die housing 50 when the lead 70 is soldered to the pad 81 on the mounting surface 80 and, e.g., one thousand ambient temperature cycles between −40 degrees Celsius and 85 degrees Celsius are performed. In some embodiments, the lead 70 comprises a side 71 having a thickness of not more than four mils, e.g., to avoid such cracking.

The IC package 100 illustrated in FIG. 3 further comprises an IC die 90 seated partially within the die cavity 51. The IC die 90 is connected to the lead pad 72 of the lead 70 by a bond wire 91. According to one or more other embodiments, the IC die 90 may be seated entirely within the die cavity 51.

Figure 4:
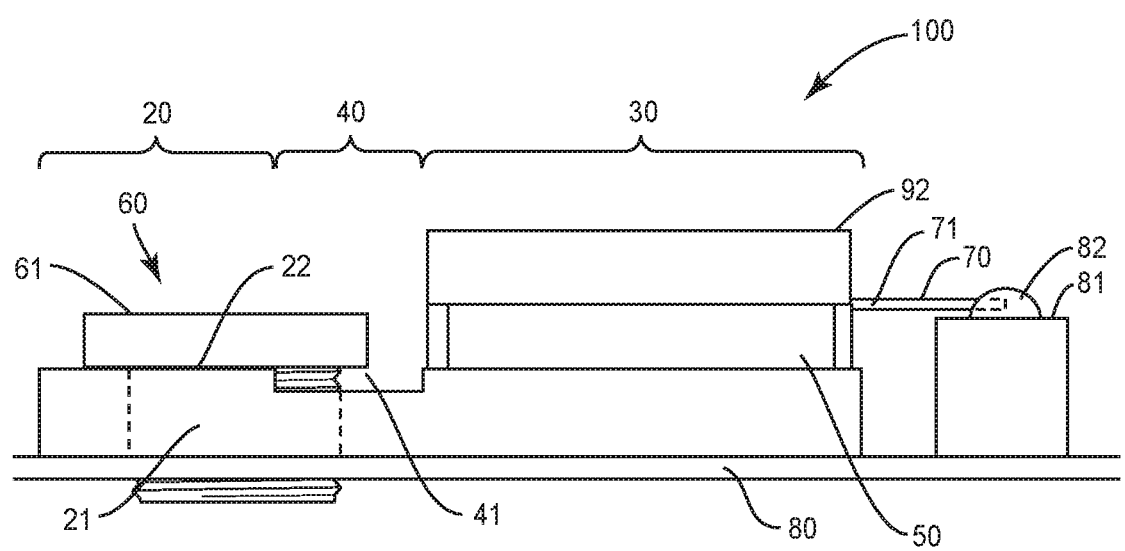
FIG. 4 is a schematic diagram of a further example IC package mounted to a mounting surface and as viewed from the side, according to one or more embodiments of the present disclosure.

The die housing 50 is may be made of plastic, resin, polymer, and/or ceramic material, which electrically insulates the IC die 90 from undesired static or other unintended electrical sources. As shown in FIG. 4, the IC package 100 may further comprise a cap 92 mounted to the die housing 50. In some embodiments, the cap 92 comprises a thermally-conductive material or shape, such that the cap acts as a heat spreader and/or heat sink. The cap 92 may additionally or alternatively be made of plastic, resin, polymer, and/or ceramic material, which electrically insulates the IC die 90 from undesired static or other unintended electrical sources. In some embodiments, the cap 92 and die housing 50 are made of the same material(s).

Figure 5:
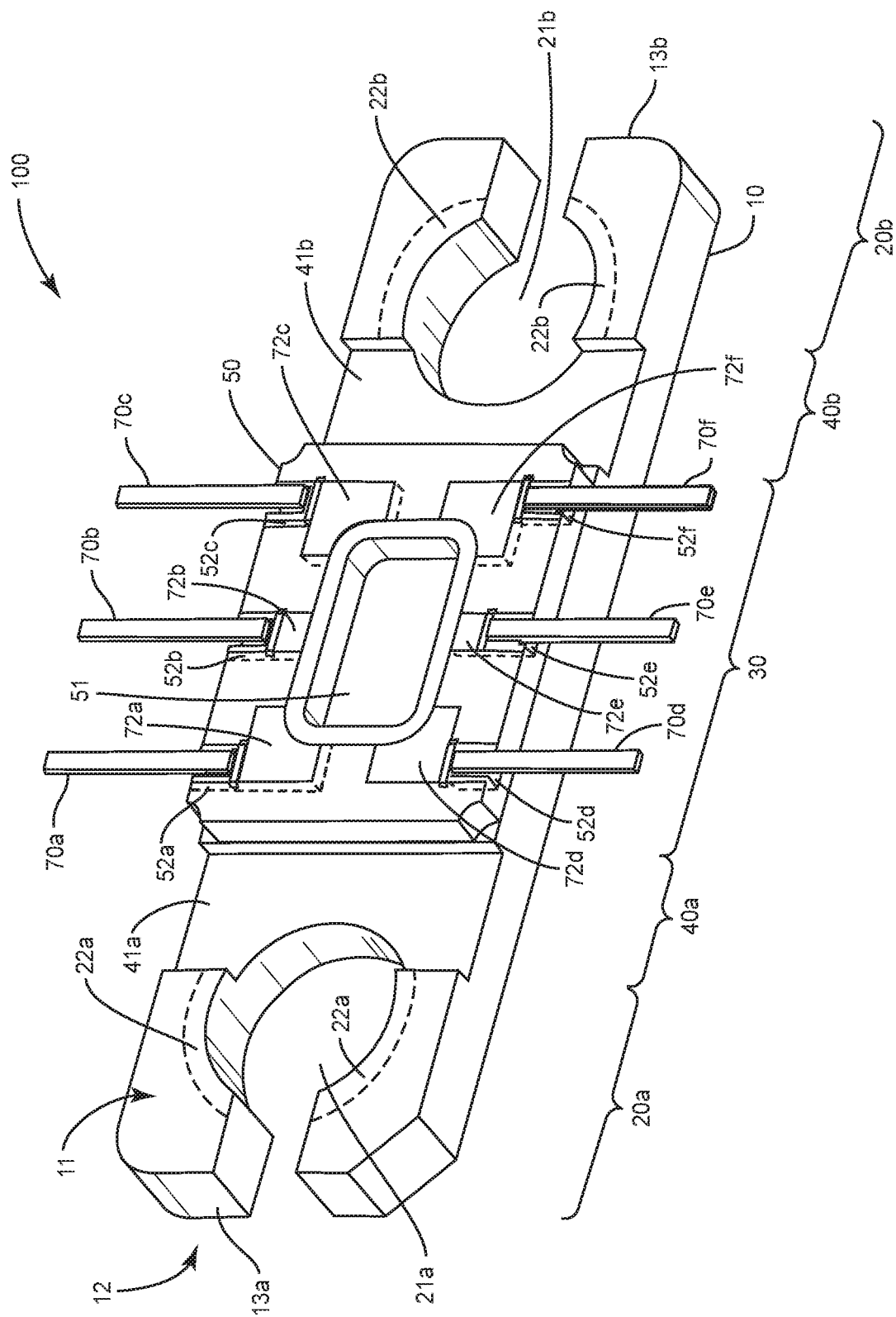
FIGS. 5 and 6 are isometric schematic diagrams of an example six-lead IC packages, each according to one or more embodiments of the present disclosure.

FIG. 5 illustrates an isometric view of another example IC package 100. The IC package 100 of FIG. 5 comprises a base 10 and an electrically-insulating die housing 50. The die housing 50 is mounted to a die mounting section 30 of the base 10, as discussed in examples above. This particular example of the IC package 100 comprises two base mounting sections 20a, 20b, each separated from the base 10 by a respective recessed section 40a, 40b. Each recessed section 40a, 40b comprises a respective recess 41a, 41b between a corresponding base mounting section 20a, 20b and the die mounting section 30. The base 10 further comprises two openings 21a, 21b. Each opening 21a, 21b, extends through the base 10 from a first side 11 of the base 10 to a second side 12 of the base 10. Each opening 21a, 21b, also extends through respective lateral sides 13a, 13b of the base 10. Each opening 21a, 21b intersects with a respective recess 41a, 41b of the recessed sections 40a, 40b, respectively. As shown in FIG. 5, each of the base mounting sections 20a, 20b comprises a respective mating surface 22a, 22b for mating with one or more fasteners (not shown in FIG. 5).

The die housing 50 illustrated in FIG. 5 comprises a die cavity 51 and six lead channels 52a-f. The IC package 100 in this example further comprises six leads 70a-f, each having a respective lead pad 70a-f. Each of the leads 70a-f is spaced apart from the die cavity 51 and is partially seated in a respective lead channel 52a-f. Lead pads 72a-f of the leads 70a-f are also each seated, at least partially, in the respective lead channels 52a-f.

Other embodiments of the IC package 100 may comprise additional, fewer, or different base mounting sections 20. For example, the IC package 100 may comprise three base mounting sections 20, each extending away from the die mounting section 30 in different directions (e.g., two in opposing directions and one laterally). Other embodiments may additionally or alternatively include a plurality of base mounting sections 20 that extend away from the die mounting section 30 in the same direction. Further, some embodiments may include one or more base mounting sections 20 that are connected to the die mounting section 30 without an intervening recessed section 40.

Embodiments of the present disclosure may additionally or alternatively comprise one or more leads 70 that extend in any direction away from the die cavity 51. Although the leads 70 of embodiments discussed above are all depicted as straight, other embodiments may include one or more gull-wing leads, J-leads, butt-leads, S-leads, spider J-leads, clip J-leads, and/or through-hole pins, for example. Accordingly, particular embodiments may correspondingly be suitable for a variety of surface mounting or through-hole mounting applications, for example.

Figure 6:
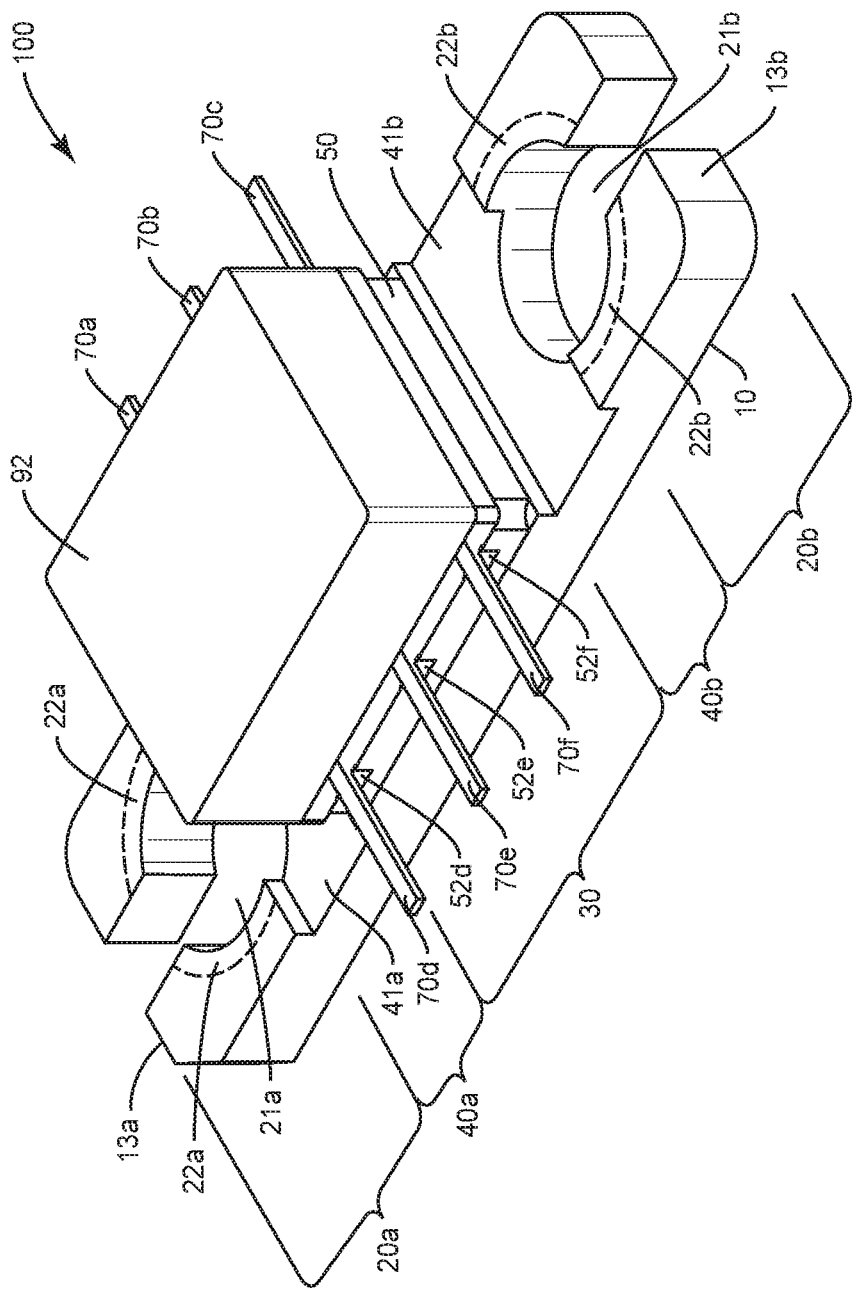

Further, the IC package 100 may comprise a cap 92 mounted to the die housing 50 as discussed above. Another example of an IC package 100 comprising such a cap 92 is shown in FIG. 6.

Figure 7:
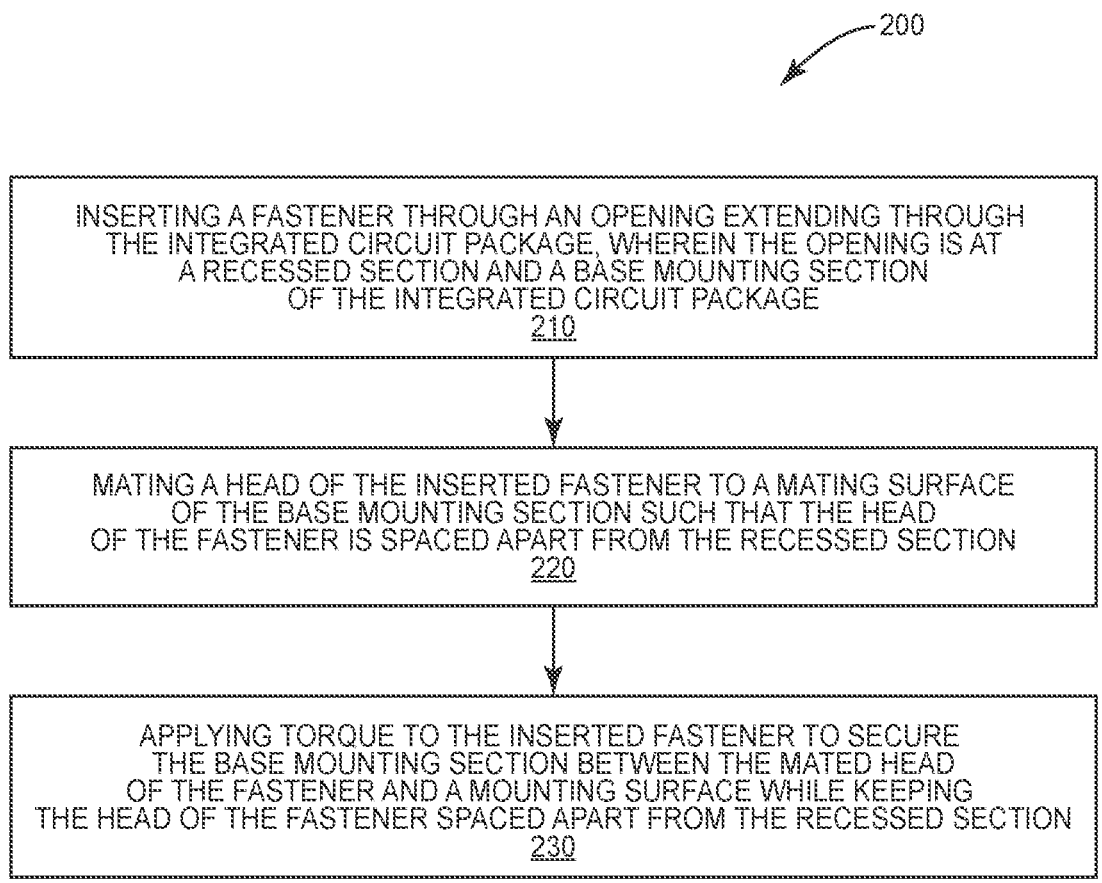
FIG. 7 is a flow diagram of an example method, according to one or more embodiments of the present disclosure.

As shown in FIG. 7, other embodiments of the present disclosure include a method 200 of mounting an IC package 100. The method 200 comprises inserting a fastener 60 through an opening 21 extending through the IC package 100 (block 210). The opening 21 is at a recessed section 40 and a base mounting section 20 of the IC package 100. The method 200 further comprises mating a head 61 of the inserted fastener 60 to a mating surface 22 of the base mounting section 20 such that the head 61 of the fastener 60 is spaced apart from the recessed section 40 (block 220). The method 200 further comprises applying torque to the inserted fastener 60 to secure the base mounting section 20 between the mated head 61 of the fastener 60 and a mounting surface 80 while keeping the head 61 of the fastener 60 spaced apart from the recessed section 40 (block 230).

Embodiments of the present disclosure may additionally or alternatively include any compatible combination of features described above or in the claims below. Embodiments may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. An integrated circuit package comprising:
   a base comprising:
      a first side, and a second side opposing the first side;
      a base mounting section and a die mounting section;
      a recessed section comprising a recess between the die mounting section and the base mounting section;
      an opening extending through the base from the first side to the second side, wherein at least a portion of the recess intersects with the opening;
   an electrically-insulating die housing mounted to the die mounting section.

2. The integrated circuit package of claim 1, wherein the base has a thickness measured between the first and second sides, the thickness of the base throughout the recessed section being less than the thickness of the base throughout the base mounting section.

3. The integrated circuit package of claim 2, wherein the thickness of the base throughout the recessed section is also less than the thickness of the base throughout the die mounting section.

4. The integrated circuit package of claim 1, wherein the base further comprises a lateral side connecting the first and second sides, and the opening further extends through the lateral side.

5. The integrated circuit package of claim 1, wherein the base mounting section comprises a mating surface configured to mate with a head of a fastener that is spaced over the recessed section when the fastener is disposed within the opening.

6. The integrated circuit package of claim 5, wherein the recessed section is configured to reduce mechanical stress on the die mounting section when torque is applied to the fastener while the mating surface and head of the fastener are mated.

7. The integrated circuit package of claim 1, wherein:
   the die housing comprises a die cavity and a lead channel spaced apart from the die cavity;
   the integrated circuit package further comprises a lead seated partially within the lead channel and extending away from the die cavity, the lead comprising a side having a thickness of not more than four mils.

8. The integrated circuit package of claim 7, wherein the lead avoids cracking of the die housing due to mechanical stress imposed by the lead upon the die housing when the lead is soldered to a pad on a mounting surface and one thousand ambient temperature cycles between −40 degrees Celsius and 85 degrees Celsius are performed.

9. The integrated circuit package of claim 1, further comprising an integrated circuit die, wherein the die housing comprises a die cavity and the integrated circuit die is seated at least partially within the die cavity.

10. An integrated circuit package comprising:
    a base comprising a die mounting section, a base mounting section, and a recessed section positioned between the die mounting section and the base mounting section;
    an opening that extends through the base at the base mounting section and the recessed section;
    wherein the recessed section is configured to reduce mechanical stress on the die mounting section when torque is applied to a fastener that is disposed within the opening.

11. The integrated circuit package of claim 10, wherein:
    the base further comprises a first side and a second side opposing the first side;
    the base has a thickness measured between the first and second sides;
    the thickness of the base throughout the recessed section is less than the thickness of the base throughout the base mounting section.

12. The integrated circuit package of claim 11, wherein the thickness of the base throughout the recessed section is also less than the thickness of the base throughout the die mounting section.

13. The integrated circuit package of claim 10, wherein:
    the base further comprises a first side, a second side opposing the first side, and a lateral side connecting the first and second sides;
    to extend through the base at the base mounting section and the recessed section, the opening extends through the base from the first side to the second side and through the lateral side.

14. The integrated circuit package of claim 10, wherein:
    the base mounting section comprises a mating surface configured to mate with a head of the fastener that is spaced over the recessed section when the fastener is disposed within the opening;
    to reduce the mechanical stress applied to the die mounting section when the torque is applied to the fastener, the recessed section is configured to reduce the mechanical stress when the torque is applied to the fastener while the mating surface and the head of the fastener are mated.

15. The integrated circuit package of claim 10, further comprising:

an electrically-insulating die housing mounted to the die mounting section, the die housing comprising a die cavity and a lead channel spaced apart from the die cavity;

a lead seated partially within the lead channel and extending away from the die cavity, the lead comprising a side having a thickness of not more than four mils.

16. The integrated circuit package of claim 15, wherein the lead avoids cracking of the die housing due to mechanical stress imposed by the lead upon the die housing when the lead is soldered to a pad on a mounting surface and one thousand ambient temperature cycles between −40 degrees Celsius and 85 degrees Celsius are performed.

17. The integrated circuit package of claim 15, further comprising an integrated circuit die seated at least partially within the die cavity.

18. An integrated circuit package comprising:
   a base comprising a die mounting section, a base mounting section, and a recessed section positioned between the die mounting section and the base mounting section;
   an electrically-insulating die housing mounted to the die mounting section, the die housing comprising a die cavity and a lead channel spaced apart from the die cavity;
   a lead seated partially within the lead channel and extending away from the die cavity, wherein the lead avoids cracking of the die housing due to mechanical stress imposed by the lead upon the die housing when the lead is soldered to a pad on a mounting surface and one thousand ambient temperature cycles between −40 degrees Celsius and 85 degrees Celsius are performed.

19. The integrated circuit package of claim 18, wherein the lead comprises a side having a thickness of not more than four mils.

20. A method of mounting an integrated circuit package, the method comprising:
   inserting a fastener through an opening extending through the integrated circuit package, wherein the opening is at a recessed section and a base mounting section of the integrated circuit package;
   mating a head of the inserted fastener to a mating surface of the base mounting section such that the head of the fastener is spaced apart from the recessed section;
   applying torque to the inserted fastener to secure the base mounting section between the mated head of the fastener and a mounting surface while keeping the head of the fastener spaced apart from the recessed section.

* * * * *